United States Patent
Kong et al.

(10) Patent No.: US 7,890,818 B2
(45) Date of Patent: **\*Feb. 15, 2011**

(54) READ LEVEL CONTROL APPARATUSES AND METHODS

(75) Inventors: Jun Jin Kong, Yongin-si (KR); Sung Chung Park, Daejeon (KR); Dongku Kang, Seongnam-si (KR); Dong Hyuk Chae, Seoul (KR); Seung Jae Lee, Hwaseong-si (KR); Nam Phil Jo, Seoul (KR); Seung-Hwan Song, Incheon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 406 days.

This patent is subject to a terminal disclaimer.

(21) Appl. No.: 12/010,043

(22) Filed: Jan. 18, 2008

(65) Prior Publication Data
US 2008/0244339 A1  Oct. 2, 2008

(30) Foreign Application Priority Data
Mar. 28, 2007  (KR) .................... 10-2007-0030396

(51) Int. Cl.
*G06F 11/00* (2006.01)
*H03M 13/00* (2006.01)
(52) U.S. Cl. .................. 714/704; 714/758; 714/785; 365/185.33
(58) Field of Classification Search .............. 714/746, 714/752, 755, 758, 774, 785, 786, 793, 795, 714/799, 807, 718, 47, 809, 704; 365/185.03, 365/185.33, 185.09, 200, 201; 375/341, 375/262
See application file for complete search history.

(56) References Cited

U.S. PATENT DOCUMENTS

| | | | |
|---|---|---|---|
| 5,784,356 | A | 7/1998 | Hayashi et al. |
| 6,212,659 | B1 | 4/2001 | Zehavi |
| 6,651,212 | B1 | 11/2003 | Katayama et al. |

(Continued)

FOREIGN PATENT DOCUMENTS

JP   08-287607   11/1996

(Continued)

OTHER PUBLICATIONS

International Search Report by Korean Intellectual Property Office of Apr. 29, 2008 for corresponding International Application No. PCT/KR2008/000145.

(Continued)

*Primary Examiner*—Phung M Chung
(74) *Attorney, Agent, or Firm*—Harness, Dickey & Pierce, P.L.C.

(57) ABSTRACT

Various read level control apparatuses and methods are provided. In various embodiments, the read level control apparatuses may include an error control code (ECC) decoding unit for ECC decoding data read from a storage unit, and a monitoring unit for monitoring a bit error rate (BER) based on the ECC decoded data and the read data. The apparatus may additionally include an error determination unit for determining an error rate of the read data based on the monitored BER, and a level control unit for controlling a read level of the storage unit based on the error rate.

25 Claims, 9 Drawing Sheets

U.S. PATENT DOCUMENTS

| | | | |
|---|---|---|---|
| 6,714,262 B1 * | 3/2004 | Tsurumi | 348/731 |
| 6,992,932 B2 | 1/2006 | Cohen | |
| 2002/0108090 A1 * | 8/2002 | Ariel et al. | 714/792 |
| 2006/0007801 A1 * | 1/2006 | Takashima | 369/44.27 |
| 2009/0210776 A1 * | 8/2009 | Cho et al. | 714/805 |

FOREIGN PATENT DOCUMENTS

| | | |
|---|---|---|
| JP | 2002-032959 | 1/2002 |
| JP | 2002-230779 | 8/2002 |
| JP | 2005-012557 | 1/2005 |
| KR | 100236379 | 12/1999 |
| KR | 1020040040714 | 5/2004 |

OTHER PUBLICATIONS

Office Action by Korean Patent Office dated May 15, 2009 for counterpart Korean Application No. 10-2007-0030396 (no English translation).

* cited by examiner

READ LEVEL CONTROL APPARATUSES AND METHODS

PRIORITY STATEMENT

This application claims priority under 35 U.S.C. §119 to Korean Patent Application No. 10-2007-0030396, filed on Mar. 28, 2007, in the Korean Intellectual Property Office, the disclosure of which is incorporated herein in its entirety by reference.

BACKGROUND

1. Field

The present disclosure relates to methods and apparatuses for controlling a read level of a storage unit.

2. Description of Related Art

When data stored in flash memories is read with an accurate read level of corresponding data, errors included in the read data may be reduced. In conventional art, read levels are typically fixed and read data may not be accurate when distributions of threshold voltages for data stored in flash memories change. Accordingly, errors may increase. For example, when threshold voltage distributions of floating gate flash memories are increased by floating poly couplings, and data is read based on existing read levels, optimal read levels increase and errors may be generated. Similarly, when threshold voltage distributions are decreased by charge losses, and data is read based on existing read levels, optimal read levels decrease and errors may be generated.

BRIEF SUMMARY

In various embodiments, the present disclosure provides a read level control apparatus. In various implementations, the read level control apparatus may include an error control code (ECC) decoding unit operable to ECC decode data read from a storage unit and a monitoring unit operable to monitor a bit error rate (BER) based on the ECC decoded data and the read data. Additionally, the read level control apparatus may include an error determination unit operable to determine an error rate of the read data based on the monitored BER, and a level control unit operable to control a read level of the storage unit based on the error rate.

In various other implementations, the read level control apparatus may include an ECC decoding unit operable to ECC decode data read from a storage unit and output a syndrome. The read level control apparatus may additionally include an error determination unit operable to determine an error rate of the read data based on the syndrome, and a level control unit operable to control a read level of the storage unit based on the error rate.

In other various embodiments, the present disclosure provides a read level control method that may include ECC decoding data read from a storage unit, outputting a syndrome, determining an error rate of the read data based on the syndrome, and controlling a read level of the storage unit based on the error rate.

BRIEF DESCRIPTION OF THE DRAWINGS

The above and other aspects and advantages of the present disclosure will become apparent and more readily appreciated from the following detailed description of various example embodiments taken in conjunction with the accompanying drawings.

DETAILED DESCRIPTION OF EMBODIMENTS

Figure 1:
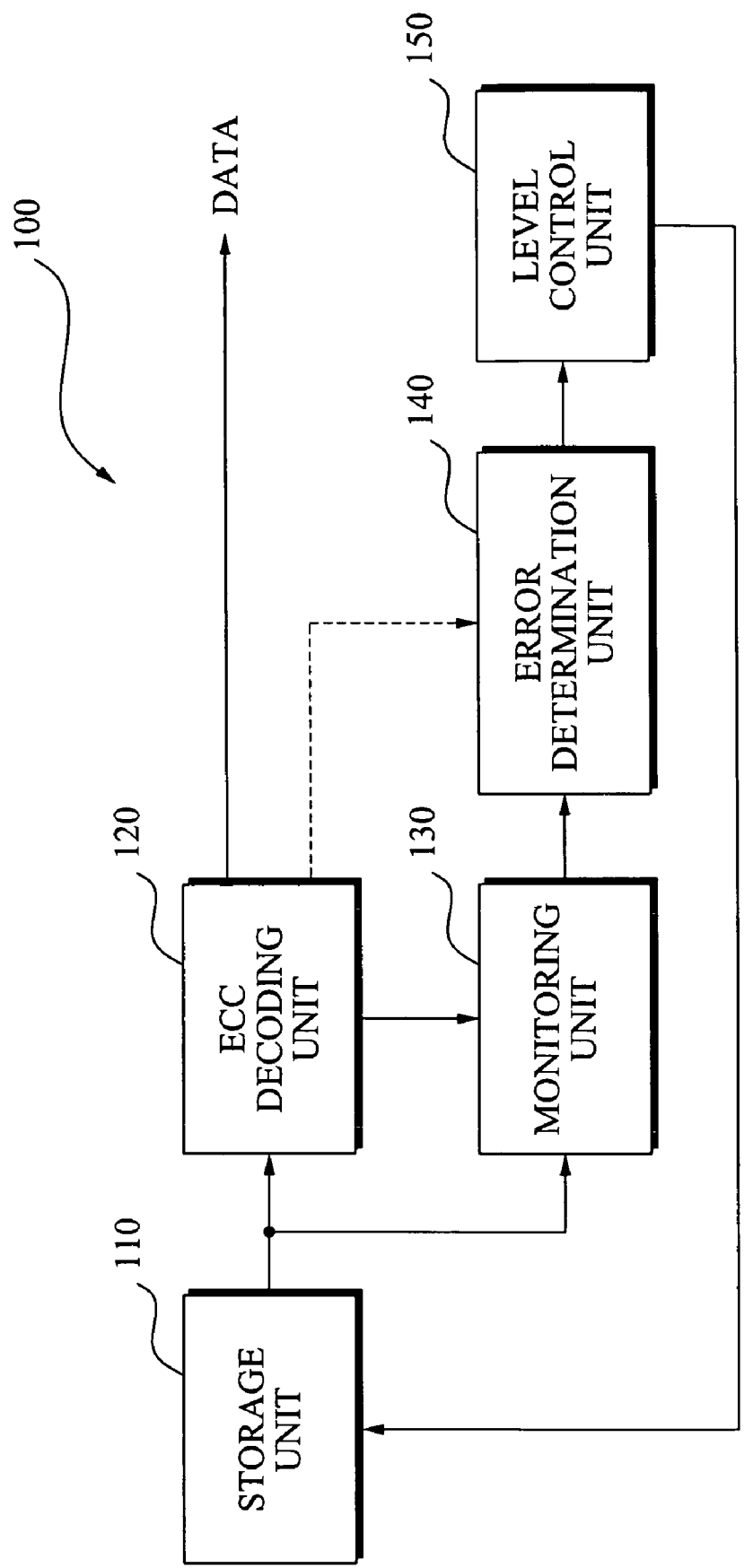
FIG. 1 is a block diagram illustrating a read level control apparatus according to various embodiments of the present disclosure.

Reference will now be made in detail to various embodiments of the present disclosure, examples of which are illustrated in the accompanying drawings, wherein like reference numerals refer to the like elements throughout. The following description is merely exemplary in nature and is in no way intended to limit the present teachings, application, or uses.

FIG. 1 provides a block diagram 100 illustrating a read level control apparatus according to various embodiments of the present disclosure. In various implementations, the read level control apparatus includes a storage unit 110, an error control code (ECC) decoding unit 120, a monitoring unit 130, an error determination unit 140, and a level control unit 150. The storage unit 110 stores data, e.g., ECC encoded data, and outputs the stored data by a read operation to the ECC decoding unit 120. More particularly, the stored data output from the storage unit 110 may be determined based on a read level of the stored data. The storage unit 110 may be any suitable non-volatile data storage medium, such as flash memory.

The ECC decoding unit 120 ECC decodes the data read from the storage unit 110 using any suitable code decoder, such as a decoder performing a non-systematic code decoding or a decoder performing a systematic code decoding. For example, in various embodiments, the ECC decoding unit 120 may include a concatenated code decoder having a convolutional code decoder, e.g., a Viterbi decoder, successively connected to a block code decoder. Or, in other embodiments, the ECC decoding unit 120 may include only a convolutional code decoder, e.g., a Viterbi decoder. Or, in yet other embodiments, the ECC decoding unit 120 may include a non-systematic code decoder when the data stored in the storage unit 110 has been encoded using a non-systematic code. Or, in still other embodiments, the ECC decoding unit 120 may include a systematic code decoder when the data stored in the storage unit 110 has been encoded using a systematic code. Or in still yet other embodiments, the ECC decoding unit 120 may include a block code decoder wherein, a decoding latency that may occur when the ECC decoding unit 120 includes the convolutional code decoder may be less than a decoding latency that may occur when the ECC decoding unit 120 includes other code decoders, for example, a concatenated code decoder, a block code decoder, a non-systematic code decoder, or a systematic code decoder.

Moreover, the ECC decoding unit 120 may include any suitable decoder and should not be limited to the various decoders described above. One skilled in the art would readily understand that various other types of ECC decoding unit 120 could be included in the read level control apparatus of FIG. 1, and remain within the scope of the present disclosure. With further reference to FIG. 1, generally, the read data output from the storage unit 110 and the corresponding ECC decoded data output from the ECC decoding unit 120 are input to the monitoring unit 120. The monitoring unit 130 utilizes the read data and corresponding ECC decoded data to determine and monitor a bit error rate (BER) of the decoded data. More particularly, when the data stored in the storage unit 110 is encoded using a non-systematic code, the ECC decoding unit 120 may include any decoder that performs non-systematic code decoding, for example, a concatenated code decoder, a convolutional code decoder, or any other non-systematic code decoder.

However, when the data stored in the storage unit 110 is encoded as non-systematic code, an accurate location of actual data in the storage unit 110 may be difficult to ascertain from the data read from the storage unit 110. Accordingly, to perform BER monitoring, the monitoring unit 130 must ECC encode the ECC decoded data received from the ECC decoding unit 120 and compare the newly ECC encoded data with the data read from the storage unit 110 to obtain a BER.

For example, when the ECC decoding unit 120 includes a concatenated code decoder, to accurately determine the location of the data in the storage unit 110, the monitoring unit 130 may need to re-ECC encode the ECC decoded data output from the convolutional decoder and compare the newly encoded, i.e., the re-ECC encoded data, with the data read from the storage unit 110, to determine and monitor the BER. Conversely, when the data stored in the storage unit 110 is encoded as a systematic code, the ECC decoding unit 120 may include any decoder that performs systematic code decoding, for example, a block code decoder or any other systematic code decoder. Additionally, because the accurate location of actual data may be ascertained from the data read from the storage unit 110, the monitoring unit 130 does not need to re-ECC encode the ECC decoded data. The BER data may then be output from the monitoring unit 130 to the error determination unit 140. The error determination unit 140 then determines an error rate of the data read from the storage unit 110 based on the BER monitored by the monitoring unit 130. In various example embodiments, the error determination unit 140 may determine the error rate of the data read from the storage unit 110 based on the BER monitored by the monitoring unit 130 and a syndrome output from the ECC decoding unit 120.

Utilization of the syndrome may occur regardless of whether an error in the read data occurs and/or an amount of data error may be determined. Generally, the syndrome is information obtained using a linear block code as an ECC and decoding. For example, a Bose-Chaudhuri-Hocquenghen (BCH) code, a Reed-Solomon (RS) code, a Cyclic Redundancy Check (CRC) code, and the like may be used as the linear block code. The BCH code or the RS code may be used for error detection and error correction. The CRC code is mainly used for error detection. In various instances, the syndrome may be a detection result of a CRC, when the CRC code is used. For example, when the ECC decoding unit 120 includes a concatenated code decoder, the error determination unit 140 may determine the error rate of the data read from the storage unit 110 based on the BER monitored by the monitoring unit 130 and a syndrome output from a block code decoder in the ECC decoding unit 120. Additionally, in various embodiments, when the ECC decoding unit 120 includes a block code decoder, the error determination unit 140 may determine the error rate of the data read from the storage unit 110 based on the syndrome output from the block code decoder.

With still further reference to FIG. 1, the level control unit 150 controls a read level of the storage unit 110 based on the error rate determined by the error determination unit 140. More specifically, the level control unit 150 controls a reference voltage of the read level of the storage unit 110 based on the error rate determined by the error determination unit 140. For example, in various embodiments, the storage unit 110 may be a floating gate flash memory device. In such instances, a threshold voltage distribution may be changed by a floating poly (FP) coupling or a charge loss, and thus the reference voltage of the read level may be changed to reduce an error generated by the change of the threshold voltage distribution. Accordingly, the level control unit 150 may reduce an error of the data read from the flash memory device, i.e., the storage unit 110, by controlling the error rate as determined by the error determination unit 140. That is, the level control unit 150 controls the reference voltage of the read level which effects the error rate determined by the error determination unit 140, e.g., determines a distribution level based on the change of the threshold voltage distribution.

In various other embodiments, the level control unit 150 may control the read level of the storage unit 110 based on the error rate determined by the error determination unit 140 and a previous read level. For example, the level control unit 150 may determine whether to increase or decrease the read level based on the present error rate determined by the error determination unit 140 and the previous read level and/or an error rate corresponding with respect to the previous read level. Furthermore, in various implementations, the level control unit 150 may control the read level so that the error rate is fixed.

Figure 2:
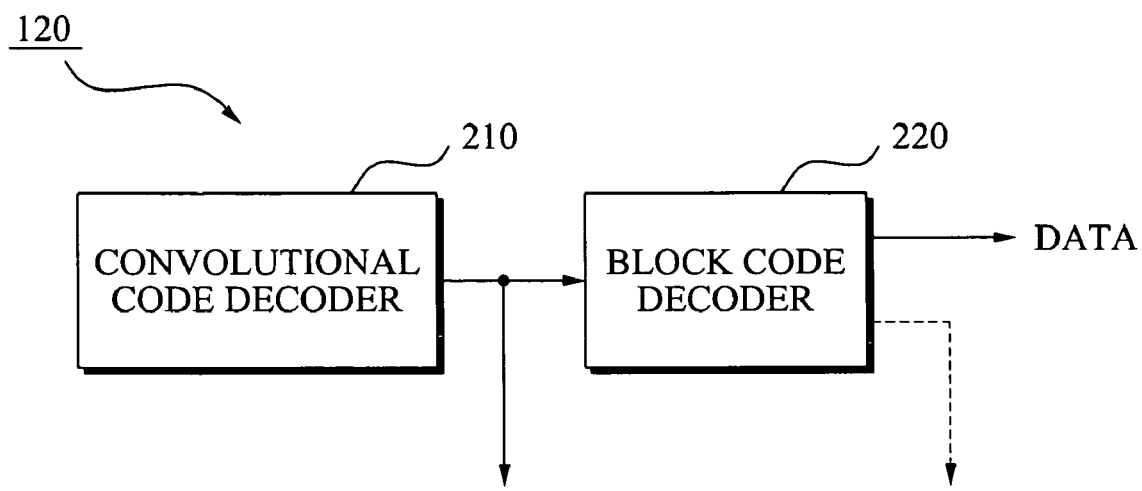
FIG. 2 is a block diagram illustrating an example of an ECC decoding unit illustrated in FIG. 1, in accordance with various embodiments of the present disclosure.

FIG. 2 is a block diagram illustrating an example of the ECC decoding unit 120 illustrated in FIG. 1. In various embodiments, the example ECC decoding unit 120 illustrated in FIG. 2 includes a convolutional code decoder 210 and a block code decoder 220. The convolutional code decoder 210 ECC decodes data read from a storage unit 110 and outputs the decoded data to the block code decoder 220 and the monitoring unit 130. Specifically, the monitoring unit 130 monitors a BER based on the ECC decoded data output from the convolutional code decoder 210, and the data read from the storage unit 110.

The block code decoder 220 ECC then decodes the data ECC decoded by the convolutional code decoder 210 again and outputs the ECC decoded data as a syndrome to the error determination unit 140. The determination unit 140 then determines an error rate of the data, read from the storage unit 110, based on the BER monitored by the monitoring unit 130 and the syndrome output from the block code decoder 220.

Figure 3:
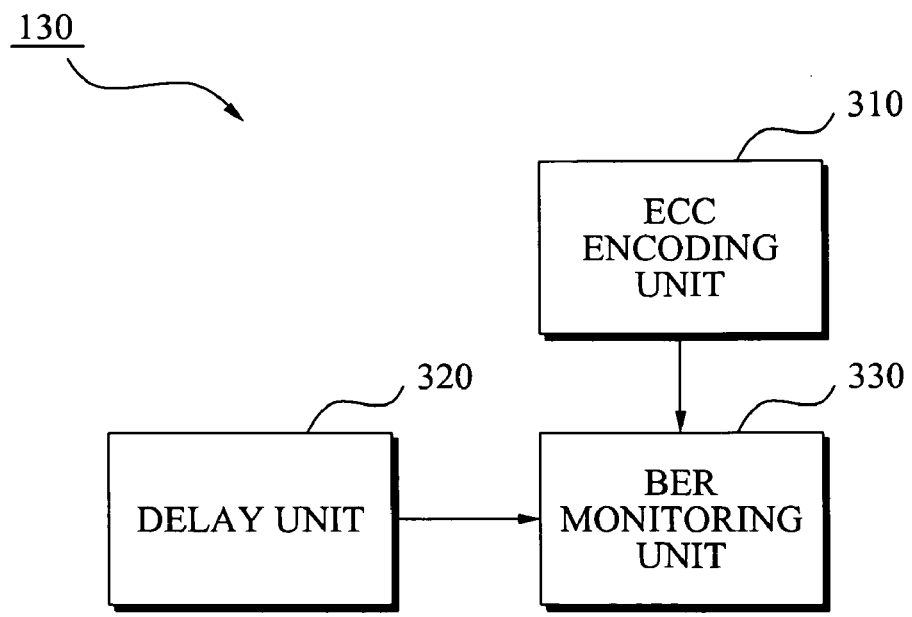
FIG. 3 is a block diagram illustrating an example of a monitoring unit illustrated in FIG. 1, in accordance with various embodiments of the present disclosure.

FIG. 3 is a block diagram illustrating an example of the monitoring unit 130 illustrated in FIG. 1. In various embodiments, the example monitoring unit 130 illustrated in FIG. 3 may be implemented when data stored in a storage unit 110 is encoded as a non-systematic code. FIG. 3 illustrates a configuration of the monitoring unit 130 when an ECC decoding unit 120 includes any one of a concatenated code decoder, a convolutional code decoder, a non-systematic code decoder, or any other decoder for performing non-systematic code decoding. In such embodiments, the monitoring unit 130 may include an ECC encoding unit 310, a delay unit 320, and a BER monitoring unit 330. The ECC encoding unit 310 ECC encodes data ECC decoded by an ECC decoding unit 120. More specifically, when the data stored in the storage unit 110 is encoded as non-systematic code, an accurate location of actual data may not be ascertained from the data read from the storage unit 110. Accordingly, the ECC encoding unit 310 re-ECC encodes the ECC decoded data output from the ECC decoding unit 120, for a BER monitoring.

The delay unit 320 delays the data read from the storage unit 110 for a specific amount of time up to a predetermined maximum delay time. For example, the delay unit 320 may delay the data read from the storage unit 110 for up to an amount of time that is substantially equal to an amount of time for ECC decoding by the ECC decoding unit 120 plus an amount of time for ECC encoding in the ECC encoding unit 310. The BER monitoring unit 330 monitors a BER based on the data re-ECC encoded by the ECC encoding unit 310 and the delayed read data. The delayed read data is the ECC encoded data which is read from the storage unit 110 and delayed by the delay unit 320.

Figure 4:
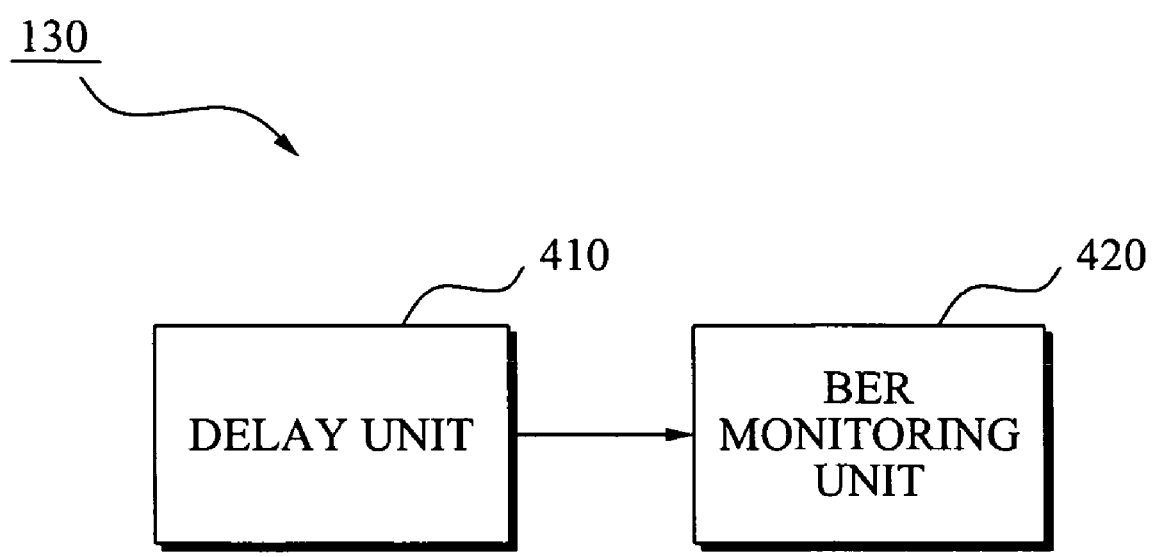
FIG. 4 is a block diagram illustrating another example of a monitoring unit illustrated in FIG. 1, in accordance with various other embodiments of the present disclosure.

FIG. 4 is a block diagram illustrating another example of the monitoring unit 130 illustrated in FIG. 1. In various other embodiments, the example monitoring unit 130 illustrated in FIG. 4 may be implemented when data stored in a storage unit 110 is encoded as a systematic code and stored. FIG. 4 illustrates a configuration of the monitoring unit 130 when an ECC decoding unit 120 includes any suitable systematic code decoder and a block code decoder, that is, a decoder performing a systematic code decoding. In such embodiments, the monitoring unit 130 includes a delay unit 410 and a BER monitoring unit 420. The delay unit 410 delays data read from the storage unit 110 for a specific amount of time up to predetermined maximum amount of time. For example, the delay unit 410 may delay the data read from the storage unit 110 for up to an amount of time that is substantially equal to an amount of time for ECC decoding by the ECC decoding unit 120, that is, an amount of time for ECC decoding by the systematic code decoder or the block code decoder.

The BER monitoring unit 420 monitors a BER based on the data ECC decoded by the ECC decoding unit 120 and the delayed read data. The delayed read data is the data which is read from the storage unit 110 and delayed by the delay unit 320. As described above, in various embodiments, the read level control may change a read level according to an error rate of the data read from the storage unit 110, and thereby reduce an error rate of the read data.

Figure 5:
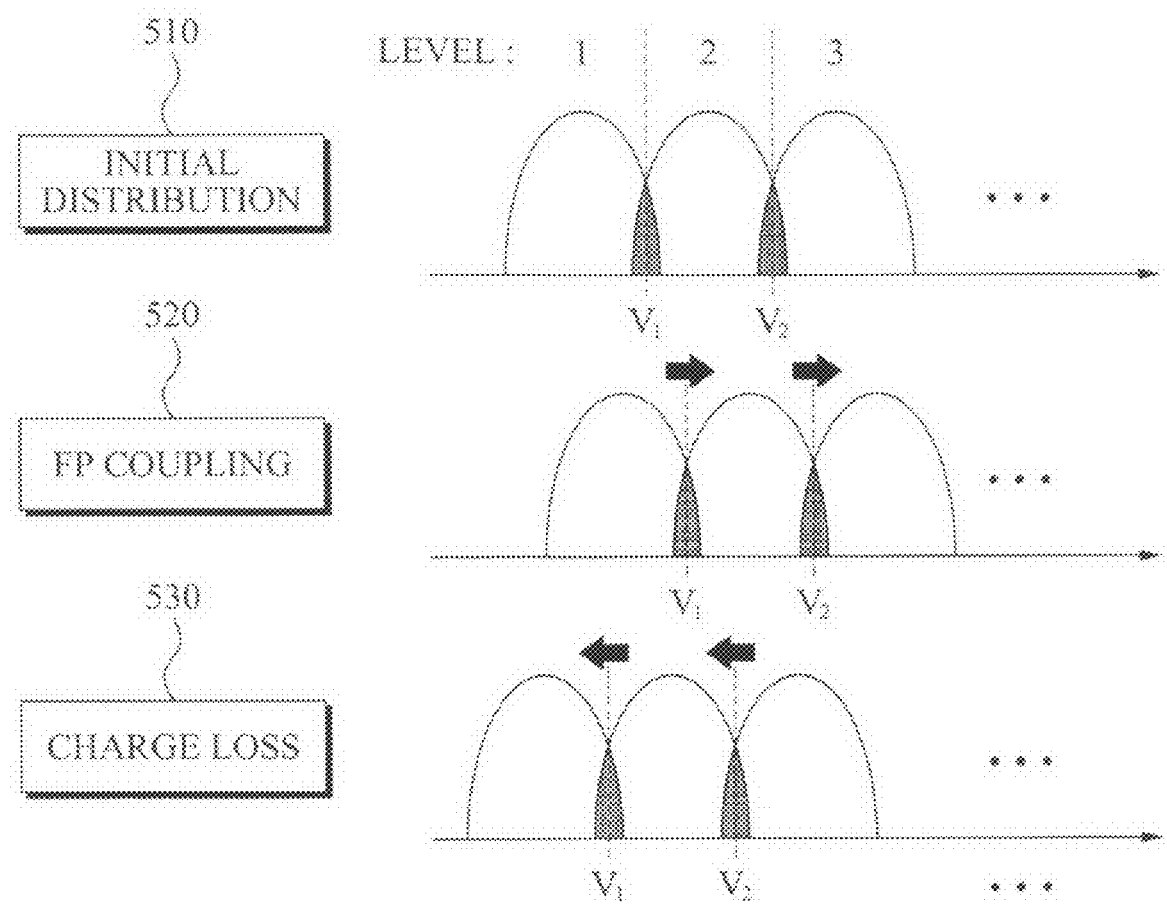
FIG. 5 is a diagram illustrating an example of an operation of a read level control apparatus according to various embodiments of the present disclosure.

FIG. 5 is a diagram illustrating an example of an operation of the read level control apparatus according to various embodiments of the present disclosure. For exemplary purposes only, FIG. 5 will be described having the storage unit 110 comprise a floating gate flash memory. In various implementations, an initial distribution 510 of a threshold voltage for the storage unit 110 may be applied at one of a plurality of predetermined threshold voltage levels, e.g., level 1, level 2, level 3, and the like. Additionally, an initial reference voltage may be set to one of a plurality of predetermined reference voltage values determines a level of each distribution, e.g., $V_1$, $V_2$, and the like. Data may then be read from the flash memory, i.e., the storage unit 110, based on the initial reference voltage setting.

Utilizing a FP coupling 520, the threshold voltage distribution may be moved to a higher voltage distribution level, and the data may be read using the initial reference voltage distribution. The increase in threshold voltage will result in an increase in error of the data, as determined by the monitoring unit 130 and the error determination unit 140. As described above, the read level of the storage unit 110, e.g., the flash memory, may be controlled by the level control unit 150. Accordingly, the error of the data read from the storage unit 110, e.g., the flash memory, may be reduced by increasing the reference voltage of the read level.

Similarly, the distribution of the threshold voltage may be moved to a lower voltage distribution level by a charge loss 530 and the data may be read using the initial reference voltage distribution. The decrease in threshold voltage will result in an increase in error of the data, as determined by the monitoring unit 130 and the error determination unit 140. As described above, the read level of the storage unit 110, e.g., the flash memory, may be controlled by the level control unit 150. Accordingly, the error of the data read from the storage unit 110, e.g., the flash memory, may be reduced by decreasing the reference voltage of the read level.

It should be noted that regardless of whether the threshold voltage distribution status determined by the FP coupling 520 may be changed to a distribution status determined by the charge loss 530, or the threshold voltage distribution status determined by the charge loss 530 may be changed to the distribution status determined by the FP coupling 520, the read level of the storage unit 110, e.g., the flash memory, may be controlled using the same operation.

Figure 6:
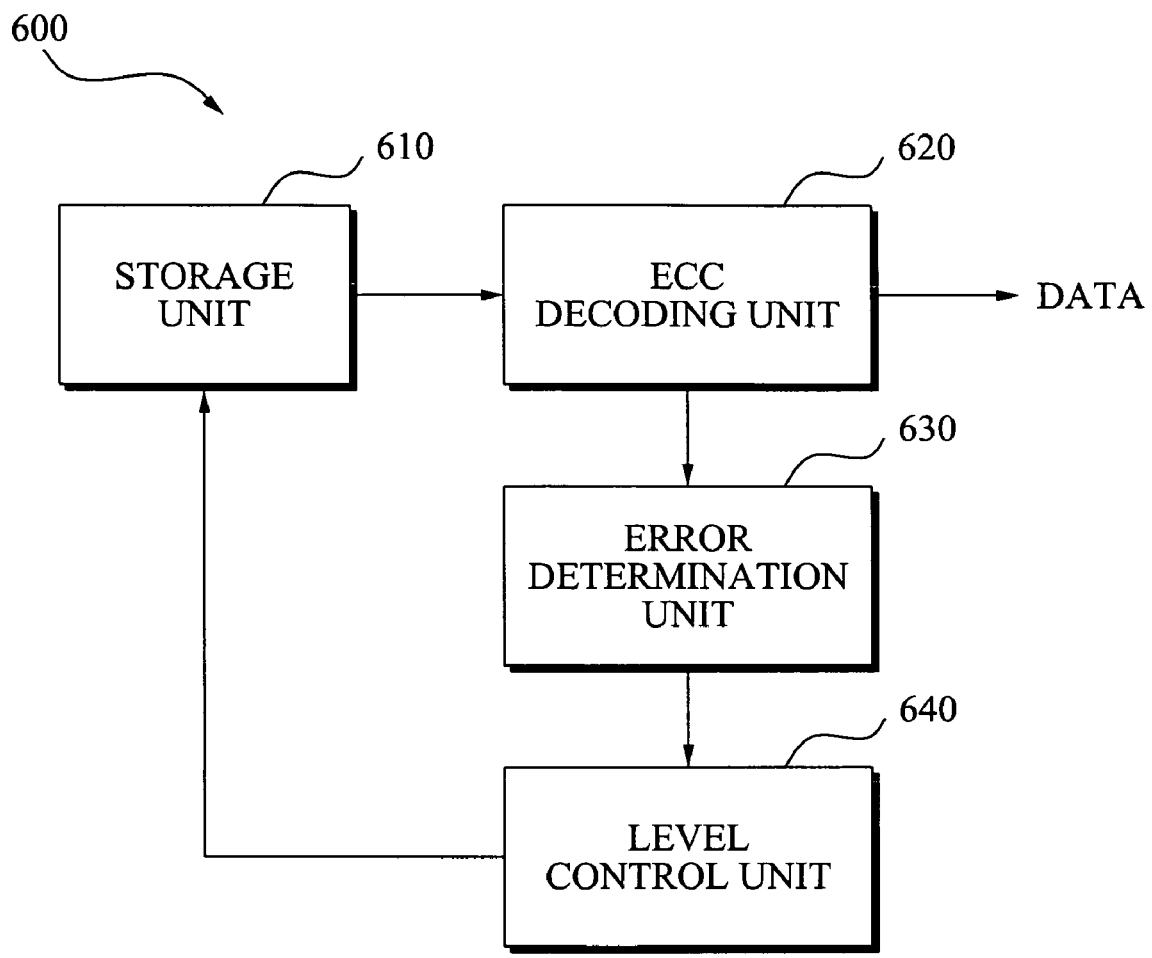
FIG. 6 is a block diagram illustrating a read level control apparatus according to other various embodiments of the present disclosure.

FIG. 6 provides a block diagram 600 illustrating a read level control apparatus in accordance with various other embodiments of the present disclosure. In various implementations, the read level control apparatus includes a storage unit 610, an ECC decoding unit 620, an error determination unit 630, and a level control unit 640. The storage unit 610, e.g., a flash memory device, stores data, e.g., ECC coded data, and outputs the stored data to the ECC decoding unit 620 through a reading operation where the ECC decoding unit 620 ECC decodes the data. The ECC decoding unit 620 may include any suitable systematic or non-systematic code decoders. Specifically, when the data stored in the storage unit 610 is encoded as a non-systematic code, the ECC decoding unit 620 includes a decoder performing a non-systematic code decoding. Similarly, when the data stored in the storage unit 610 is encoded as a systematic code and stored, the ECC decoding unit 620 includes a decoder performing a systematic code decoding.

For example, when the ECC decoding unit 620 performs non-systematic code decoding, the ECC decoding unit 620 may include a concatenated code decoder, a convolutional code decoder, or any other suitable non-systematic code decoder. Or, when the ECC decoding unit 620 performs systematic code decoding, the ECC decoding unit 620 may include a suitable systematic code decoder and a block code decoder.

The error determination unit 630 receives the decoded data from the ECC decoding unit 620 and determines an error rate of the data read from the storage unit 610 based on a syndrome. The syndrome may be generated or output while ECC decoding by the ECC decoding unit 620. For example, the syndrome may be a detection result of a CRC. The error determination unit outputs the determined error rate to the level control unit 640, and based on the received error rate, the level control unit 640 controls the read level of the storage unit 610.

Figure 7:
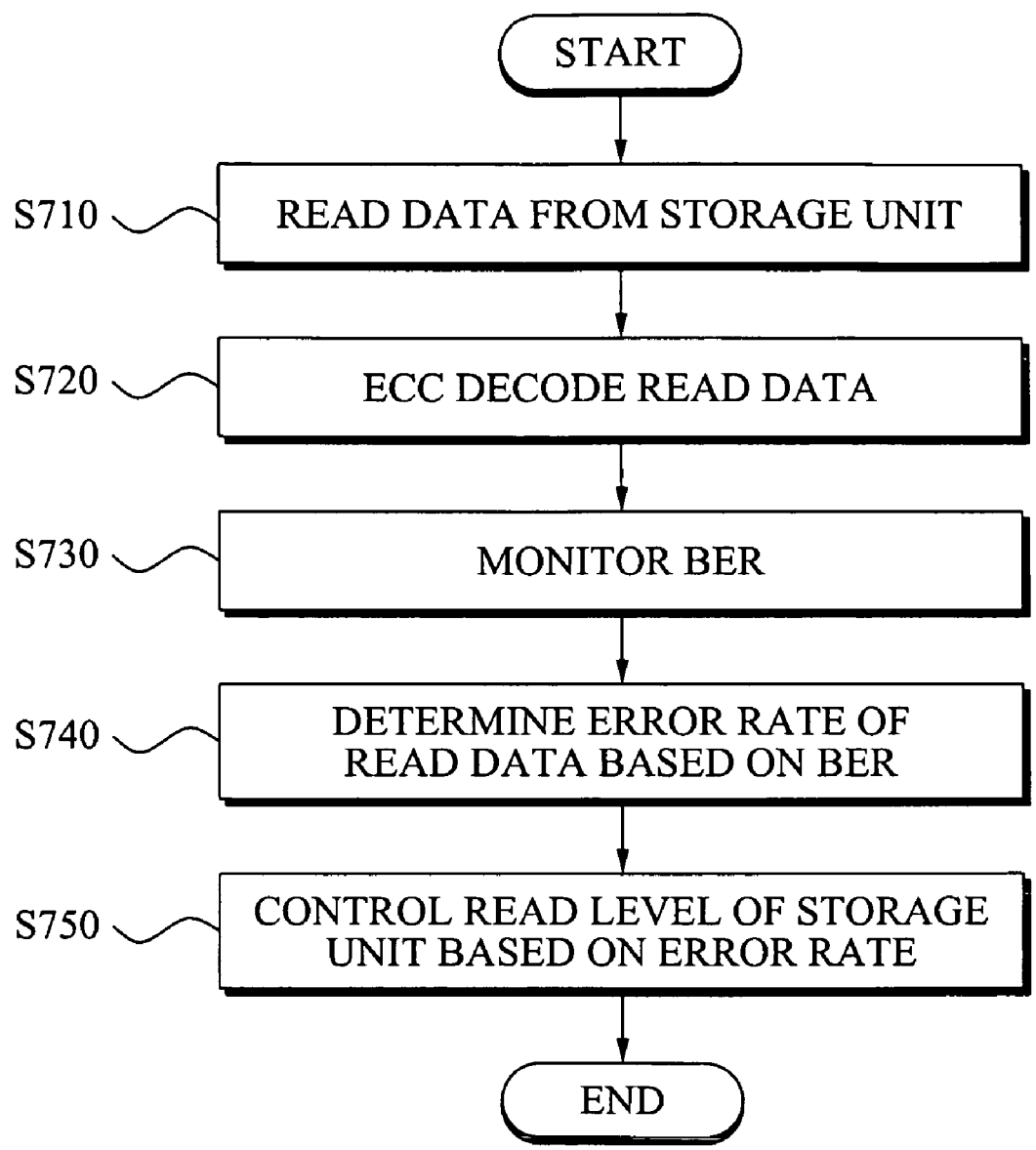
FIG. 7 is a flowchart illustrating a read level control method according to various embodiments of the present disclosure.

FIG. 7 is a flowchart illustrating a read level control method, according to various embodiments of the present disclosure. As illustrated in operation S710, data may be read from a storage unit, e.g., storage unit 110, and output to the ECC decoding unit, e.g., ECC decoding unit 120. In the present example, the storage unit may be a flash memory device. In operation S720, the data read from the storage unit may be ECC decoded by the ECC decoding unit. As described above, the read data may be ECC decoded by any one of a concatenated code decoder, a convolutional code decoder, a non-systematic code decoder, or a systematic code decoder.

For example, when the data stored in the storage unit is encoded as a non-systematic code, the read level control method ECC decodes the data using a decoder performing a non-systematic code decoding, e.g., a concatenated code decoder, a convolutional code decoder, or a non-systematic code decoder. Alternatively, when the data stored in the storage unit 610 is encoded as a systematic code, the read level control method ECC decodes the data using a decoder performing a systematic code decoding, for example, a systematic code decoder and a block code decoder.

As illustrated in operation S730, once the data read from the storage unit is ECC decoded, a BER may be monitored based on the ECC decoded data. In various embodiments, the BER may be monitored utilizing a monitoring unit, e.g., monitoring unit 130, that monitors the BER based on the ECC decoded data and the corresponding data read from the storage unit, as described above. For example, when the read data is ECC decoded using non-systematic code decoding, the BER may be monitored based on the data read from the storage unit and re-ECC encoded data, as described above. That is, in various implementations, if the read data is ECC decoded by the concatenated code decoder, i.e., a convolutional code decoder connected to a block code decoder, the BER may be monitored based on the data read from the storage unit and the corresponding data that may be ECC decoded and then re-ECC encoded by the convolutional code decoder. As illustrated in operation S740, once the BER is monitored, an error rate of the data read from the storage unit may be determined based on the monitored BER, utilizing an error determination unit, e.g., the error determination unit 140 or 630. For example, in various implementations, the error rate may be determined based on the monitored BER and a syndrome output after ECC decoding.

As illustrated in operation S750, the error rate of the read data may be input to a level control unit, e.g., the lever control unit 150 or 640, where a read level of the storage unit may be controlled based on the determined error rate. Specifically, a read reference voltage determining a threshold voltage distribution level of the storage unit may be controlled.

Figure 8:
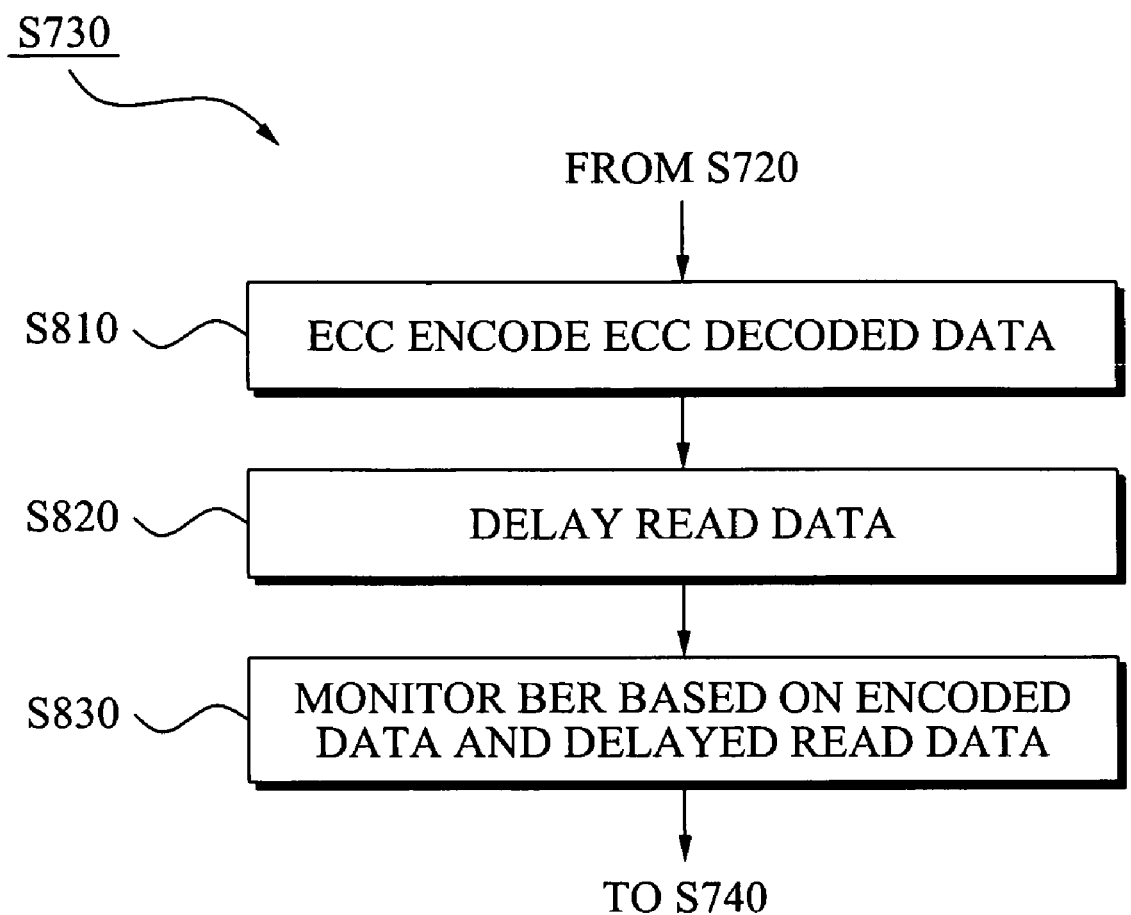
FIG. 8 is a flowchart illustrating an example of operation of the flowchart illustrated in FIG. 7, in accordance with various embodiments of the present disclosure.

FIG. 8 is a flowchart illustrating an example of operation S730 illustrated in FIG. 7. More specifically, FIG. 8 illustrates a BER monitoring operation when the data read from the storage unit is ECC decoded by an ECC decoder performing non-systematic code decoding. As illustrated in operation S810, the read data that is ECC decoded by the ECC decoding unit using non-systematic code decoding may be ECC encoded, i.e., re-ECC encoded. For example, if the ECC decoding unit includes a concatenated code decoder having a convolutional code decoder and a block code decoder, the data ECC decoded by the convolutional code decoder may be ECC encoded again, i.e., re-ECC encoded.

As illustrated in operation S820, the data read from the storage unit may be delayed for a specific amount of time up to a predetermined maximum delay time, for example, the data read from the storage unit may be delayed for up to an amount of time that is substantially equal to an amount of time for ECC decoding the data plus an amount of time for ECC encoding the ECC decoded data. As illustrated in operation S830, the BER may then be monitored based on the delayed data read from the storage unit and the ECC encoded data, e.g., the re-ECC encoded data. Although FIG. 8 illustrated operation S820 being performed after operation S810, in various embodiments, operation S820 may be performed before or simultaneously with operation S810 and remain within the scope of the present disclosure.

Figure 9:
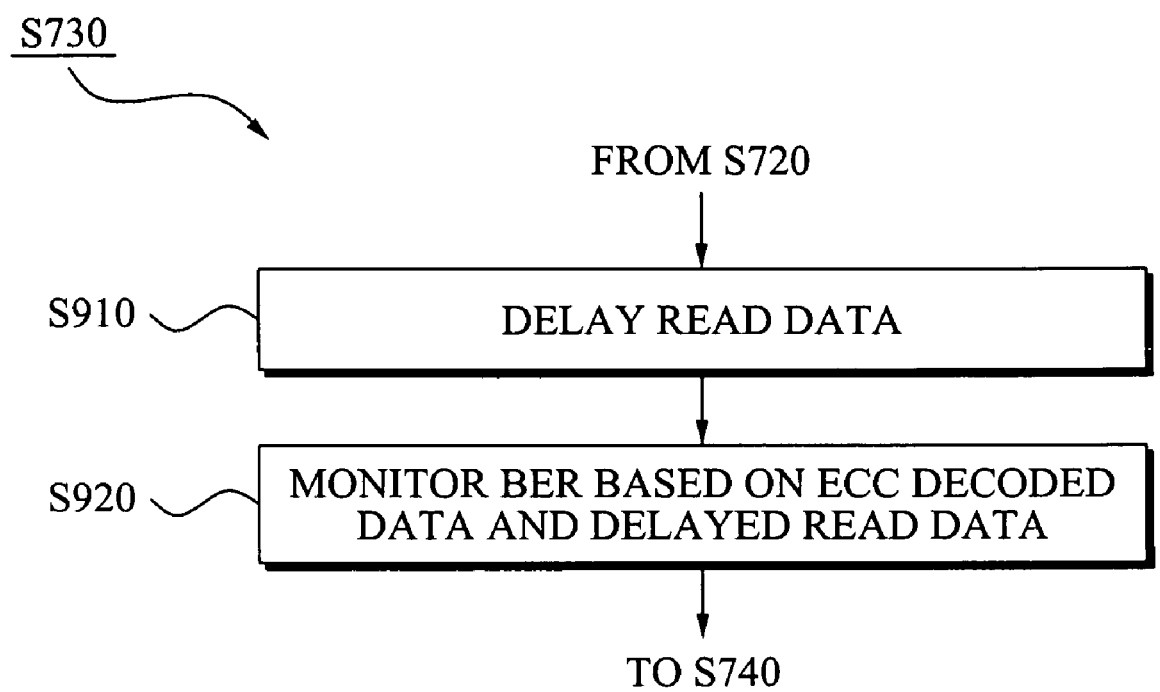
FIG. 9 is a flowchart illustrating another example of operation of the flowchart illustrated in FIG. 7, in accordance with various other embodiments of the present disclosure.

FIG. 9 is a flowchart illustrating another example of operation S730 illustrated in FIG. 7, in accordance with various other embodiments of the present disclosure. More specifically, FIG. 9 illustrates a BER monitoring operation when the read data is ECC decoded by an ECC decoder performing systematic code decoding. As illustrated in operation S910, during monitoring of BER, the data read from the storage unit may be delayed for a specific amount of time up to a predetermined maximum delay time. For example, the data read from the storage unit may be delayed for up to an amount of time that is substantially equal to an amount of time for ECC decoding the data read from the storage unit. As illustrated in operation S920, the BER may then be monitored based on the delayed data read from the storage unit and the data ECC decoded by the ECC decoder.

Figure 10:
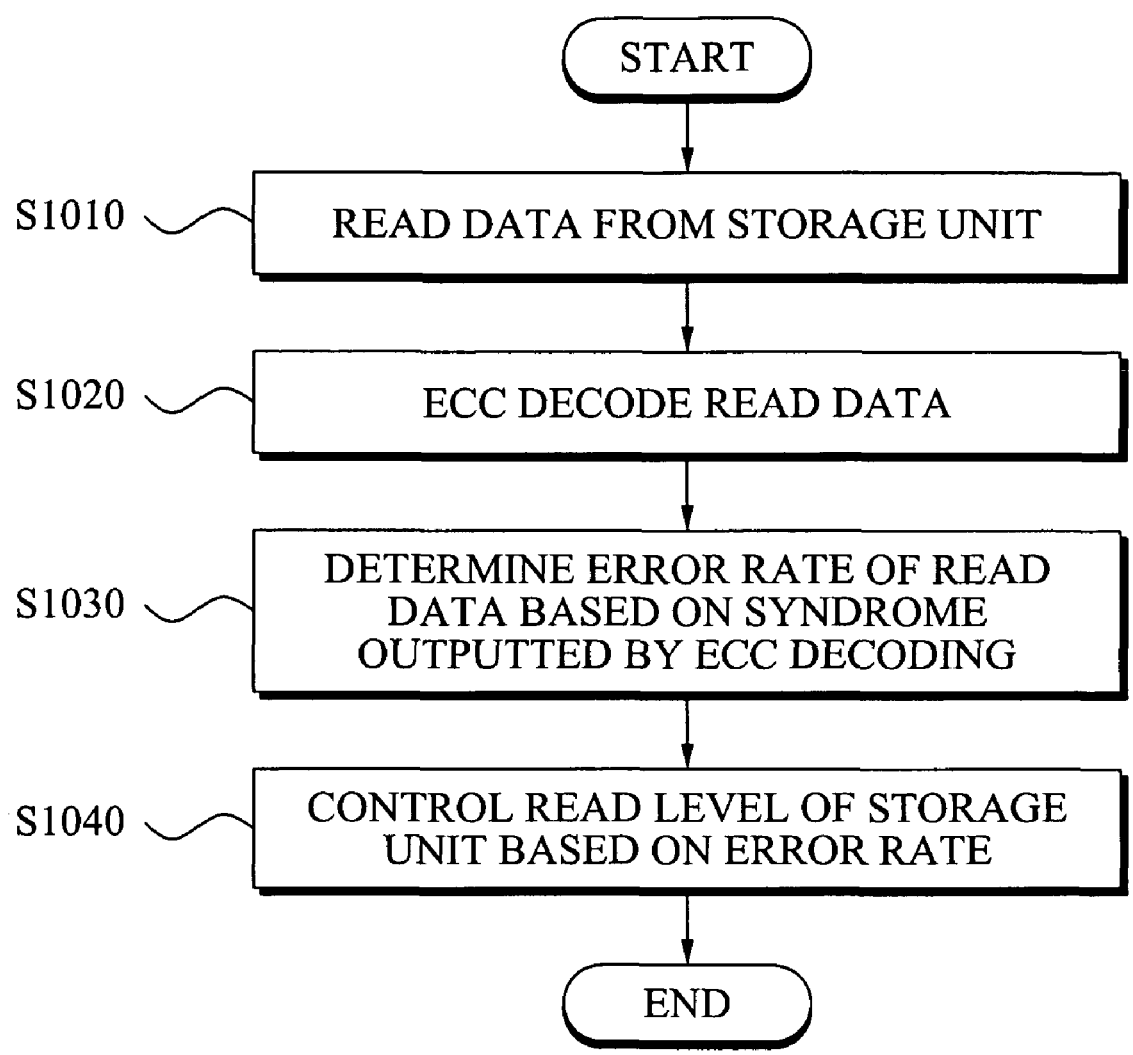
FIG. 10 is a flowchart illustrating a read level control method according to various embodiments of the present disclosure.

FIG. 10 is a flowchart illustrating a read level control method according to various other embodiments of the present invention. As illustrated in operation S1010, data may be read from a storage unit, e.g., storage unit 610, and output to an ECC decoding unit, e.g., ECC decoding unit 620. As illustrated in operation S1020, the data output from the storage unit may be ECC decoded utilizing either non-systematic code decoding or systematic code decoding. For example, the data read from the storage unit may be ECC decoded by any one of a concatenated code decoder, a convolutional code decoder, a non-systematic code decoder, a systematic code decoder, or a block code decoder.

As illustrated in operation S1030, after the data read from the storage unit is ECC decoded a syndrome is output to an error determination unit, e.g., error determination unit 630, where an error rate of the decoded data may be determined based on the syndrome. Then, as illustrated in operation S1040, after the error rate is determined, a read level of the storage unit may be controlled based on the determined error rate, utilizing a level control unit, e.g., level control unit 640.

The various above-described embodiments of the present disclosure may be recorded in computer-readable media including program instructions to implement various operations embodied by a computer. The media may also include, alone or in combination with the program instructions, data files, data structures, and the like. The media and program instructions may be those specially designed and constructed for the purposes of the present disclosure, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. The media may also be a transmission medium such as optical or metallic lines, wave guides, etc., including a carrier wave transmitting signals specifying the program instructions, data structures, etc. Examples of program instructions include both machine code, such as produced by a compiler, and files containing higher level code that may be executed by the computer using an interpreter. The described hardware devices may be configured to act as one or more software modules in order to perform the operations of the above-described embodiments of the present disclosure.

According to the present disclosure, the various read level control apparatuses and methods described herein control a read level of a storage unit, e.g., a flash memory device, in order to reduce an error rate of data through an ECC decoder. For example, in various implementations, the read level control apparatuses and methods described herein ascertain an error rate of data ECC decoded by an ECC decoder, control a read level of a storage unit based on the error rate, and thereby may reduce an error of the data read from the storage unit. Additionally, in various implementations the read level control apparatuses and methods may ascertain an error rate of read data using additional information, generated when ECC decoding, and read reliable data from a storage unit based on the error rate. Furthermore, in various implementations, the read level control apparatuses and methods may control a read level of a storage unit based on an error rate of ECC decoded data, and thereby may improve a functional deterioration due to a retention or an endurance.

A flash memory device and/or memory controller according to the present invention may be packaged using various types of packages. For example, a flash memory device and/or memory controller according to the present invention may be packaged using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

A flash memory device and/or memory controller may include a memory card. In this case, a memory controller may be configured to communicate with an external device, for example, a host, via any one of various interface protocols such as Universal Serial Bus (USB), MultiMediaCard (MMC), PCI Express (PCI-E), Serial Advanced Technology Architecture (SATA), Parallel Advanced Technology Architecture (PATA), Small Computer System Interface (SCSI), Enhanced Small Disk Interface (ESDI), and Integrated Drive Electronics (IDE).

A flash memory device is a non-volatile memory device that can maintain stored data, even when power is cut. Due to the increase in use of mobile devices such as a cellular phone, personal digital assistant (PDA), digital camera, portable game console, and Moving Picture Experts Group (MPEG) Audio-Layer 3 (MP3) player, a flash memory device is widely used as a code storage as well as a data storage. Also, a flash memory device may be used for a home application such as a high-definition television (HDTV), Digital Video Disc (DVD), router, and Global Positioning System (GPS).

A computing system according to the present invention includes a microprocessor electrically connected to a bus, user interface, MODEM such as a baseband chipset, memory controller, and flash memory device. N-bit data (N=1 or a positive number greater than 1) which have been or will be processed by a microprocessor is stored in a flash memory device through a memory controller. When the computing system according to the present invention is a mobile device, a battery to supply an operating voltage of computing system is additionally provided.

It is apparent to those skilled in the related art that the computing system according to the present invention may be further provided with an application chipset, camera image processor (CIS), mobile dynamic random access memory (DRAM), and the like. For example, a memory controller and flash memory device may include a solid state drive/disk (SSD) which uses a non-volatile memory for storing data.

Although various example embodiments of the present disclosure have been shown and described, the present disclosure is not limited to the described embodiments. Instead, it would be appreciated by those skilled in the art that changes may be made to these embodiments without departing from the principles and spirit of the disclosure, the scope of which is defined by the claims and their equivalents.

What is claimed is:

1. A read level control apparatus, comprising:
   an error control code (ECC) decoding unit operable to ECC decode data read from a storage unit;
   a monitoring unit operable to monitor a bit error rate (BER) based on the ECC decoded data and the read data;
   an error determination unit operable to determine an error rate of the read data based on the monitored BER; and
   a level control unit operable to control a read level of the storage unit based on the error rate.

2. The read level control apparatus of claim 1, wherein the error determination unit is operable to receive a syndrome output from the ECC decoding unit, and to determine the error rate of the read data based on the BER and the syndrome.

3. The read level control apparatus of claim 2, wherein the syndrome comprises a detection result of a cyclic redundancy check (CRC).

4. The read level control apparatus of claim 1, wherein the monitoring unit comprises:
   an ECC encoding unit operable to encode the ECC decoded data;
   a delay unit operable to delay the read data for up to a predetermined amount of time; and
   a BER monitoring unit operable to monitor the BER based on the encoded data and the delayed read data.

5. The read level control apparatus of claim 4, wherein the ECC decoding unit comprises a decoder operable to perform a non-systematic code decoding.

6. The read level control apparatus of claim 5, wherein the ECC decoding unit comprises a concatenated code decoder including a convolutional code decoder and a block code decoder connected in series.

7. The read level control apparatus of claim 6, wherein the ECC encoding unit is operable to encode the ECC decoded data output from the convolutional code decoder.

8. The read level control apparatus of claim 7, wherein the error determination unit is operable to determine the error rate based on the monitored BER and a syndrome output from the block code decoder.

9. The read level control apparatus of claim 5, wherein the ECC decoding unit comprises a convolutional code decoder.

10. The read level control apparatus of claim 5, wherein the ECC decoding unit comprises a non-systematic code decoder.

11. The read level control apparatus of claim 1, wherein the monitoring unit comprises:
    a delay unit operable to delay the read data for up to a predetermined amount of time; and
    a BER monitoring unit operable to monitor the BER based on the ECC decoded data and the delayed read data.

12. The read level control apparatus of claim 11, wherein the ECC decoding unit comprises a decoder operable to perform a systematic code decoding.

13. The read level control apparatus of claim 12, wherein the ECC decoding unit comprises a systematic code decoder.

14. The read level control apparatus of claim 12, wherein the ECC decoding unit comprises a block code decoder.

15. The read level control apparatus of claim 1, wherein the storage unit comprises a flash memory device.

16. The read level control apparatus of claim 1, wherein the level control unit is operable to control the read level of the storage unit based on the error rate and a previous read level.

17. A read level control apparatus, comprising:
   an ECC decoding unit operable to ECC decode data read from a storage unit and output a syndrome;
   an error determination unit operable to determine an error rate of the read data based on the syndrome; and
   a level control unit operable to control a read level of the storage unit based on the error rate.

18. The read level control apparatus of claim 17, wherein the ECC decoding unit comprises one of a concatenated code decoder, a convolutional code decoder, a non-systematic code decoder, a systematic code decoder, and a block code decoder.

19. A read level control method, comprising:
   ECC decoding data read from a storage unit;
   monitoring a BER of the decoded data based on the ECC decoded data and the read data;
   determining an error rate of the read data based on the monitored BER; and
   controlling a read level of the storage unit based on the error rate.

20. The read level control method of claim 19, wherein the determining determines the error rate of the read data comprises determining the error rate based on the BER and a syndrome generated by the ECC decoding.

21. The read level control method of claim 20, wherein the syndrome comprises a detection result of a Cyclic Redundancy Check (CRC).

22. The read level control method of claim 19, wherein the monitoring comprises:
   delaying the read data for up to a predetermined amount of time; and
   monitoring the BER based on the encoded data and the delayed read data.

23. A read level control method comprising:
   ECC decoding data read from a storage unit and outputting a syndrome;
   determining an error rate of the read data based on the syndrome; and
   controlling a read level of the storage unit based on the error rate.

24. The read level control method of claim 23, wherein the ECC decoding the read data and outputting the syndrome comprise ECC decoding the read data utilizing one of the concatenated code decoder, a convolutional code decoder, a non-systematic code decoder, a systematic code decoder, and a block code decoder.

25. A computer-readable data storage device, said device comprising:
   a non-transitory computer readable medium having stored thereon computer readable instructions for controlling a read level of the data storage device, the instructions comprising:
   instructions executable to ECC decode data read from a storage unit;
   instructions executable to monitor BER based on the ECC-decoded data and the read data;
   instructions executable to determine an error rate of the read data based on the monitored BER; and
   instructions executable to control read level of the storage unit based on the error rate.

* * * * *